United States Patent [19]

Shank et al.

[11] Patent Number: 4,716,345
[45] Date of Patent: Dec. 29, 1987

[54] AUTOMATIC PULSE DISPLAY

[75] Inventors: Gordon W. Shank, Portland, Oreg.; Earl P. Eason, Livermore, Calif.

[73] Assignee: Tektronix, Inc., Beaverton, Oreg.

[21] Appl. No.: 909,343

[22] Filed: Sep. 19, 1986

[51] Int. Cl.[4] ...................... G01R 13/28; H04N 3/223
[52] U.S. Cl. ............................... 315/392; 324/121 R; 364/487; 358/180
[58] Field of Search .............................. 315/392, 403; 324/121 R; 358/77, 137, 180; 364/487

[56] References Cited

U.S. PATENT DOCUMENTS 4,490,653 12/1984 Olmstead ........................... 315/403

OTHER PUBLICATIONS

"Internal Computer Automates Oscilloscope," *Electronic Product Design*, Rolfe, 10/80, pp. 45-48.

*Primary Examiner*—Theodore M. Blum
*Assistant Examiner*—David Cain
*Attorney, Agent, or Firm*—Mark L. Becker; George T. Noe

[57] ABSTRACT

A method for automatically expanding and displaying a narrow pulse on an oscilloscope screen. The time sweep signal of the oscilloscope is first set to contain a predetermined number of input signal cycles. The speed of the time sweep is increased by an internal controller a number of settings to expand the signal cycle by a factor sufficient to place less than a single signal cycle within the sweep signal and an expanded singal pulse of greater than a specified duty factor outside the sweep signal. The dual trigger generators of the scope are set to trigger on opposite slopes of the pulse. If both trigger generators trigger, then the pulse is within the specified duty factor and the controller directs it to be displayed on the oscilloscope screen in its expanded form. The specified duty factor can be made exact by adjusting the duration of the sweep signal to match the duration of the duty factor once the period of the signal cycle is determined.

7 Claims, 8 Drawing Figures

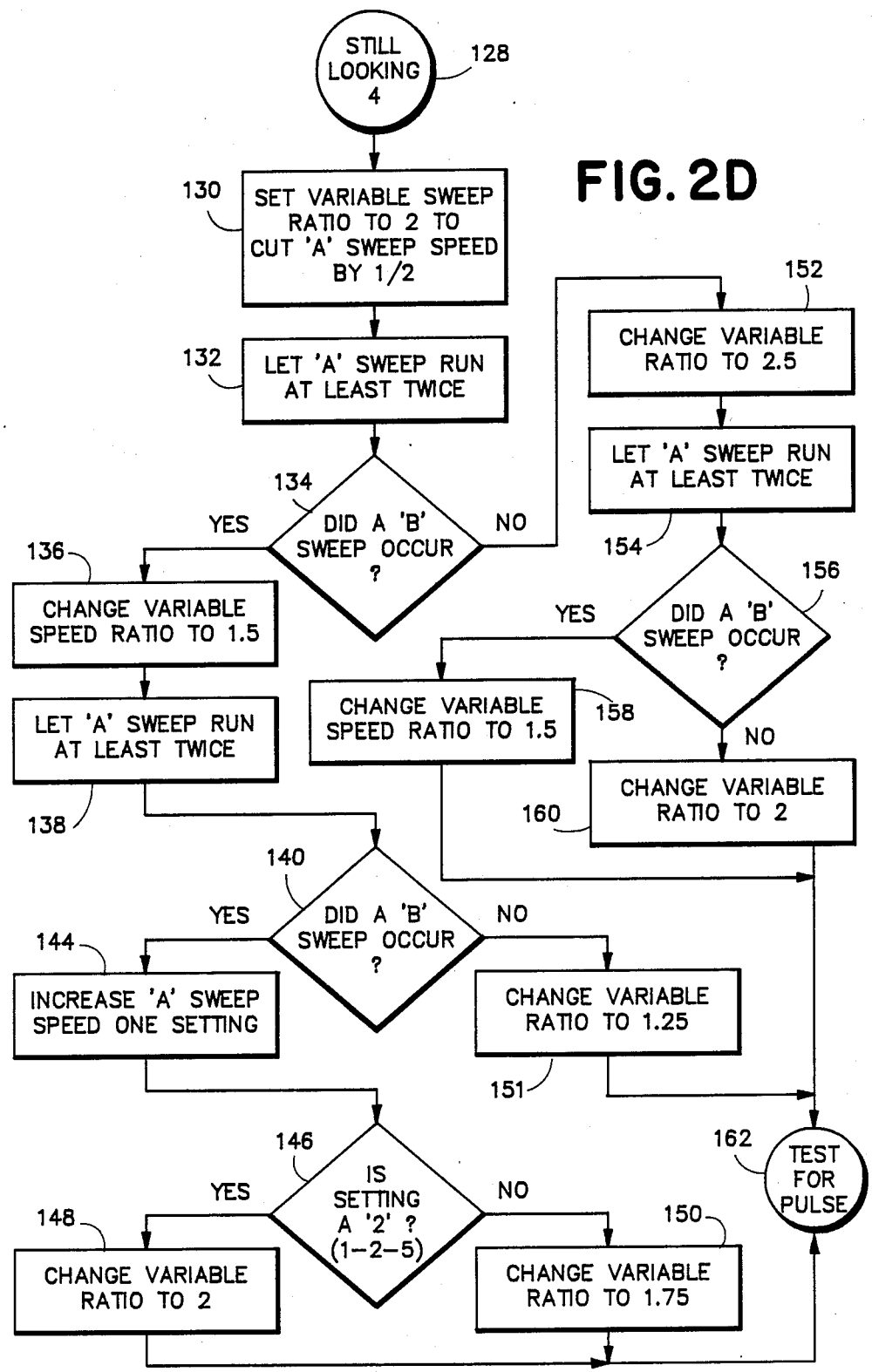

AUTOMATIC PULSE DISPLAY

FIELD OF THE INVENTION

This invention relates to oscilloscope sweep systems and more particularly to automatic pulse display utilizing the sweep system to set up the time scale of a signal pulse waveform display for easier viewing.

BACKGROUND OF THE INVENTION

An input signal that consists of a series of narrow repetitive pulses is often difficult to detect visually with a conventional oscilloscope. The pulses appear as a series of spikes whose duration and shape are not easily determined without complicated manual adjustment of the vertical gain, sweep speed, display position, and triggering point. Such adjustment of an oscilloscope often requires an operator who is thoroughly familiar with the controls of the particular model at hand. However, the engineer or technician faced with the task may only use an oscilloscope infrequently. For such an occasional user, making the necessary adjustments to permit accurate viewing of the pulse is a time-consuming and difficult task.

Recognizing this problem inherent in operation of oscilloscopes, designers have added an "auto-setup" feature that automatically adjusts the amplitude and sweep speed of the oscilloscope to display a predetermined range of signal cycles. Typically two to five cycles are shown depending on the signal frequency simply by pushing an appropriately labeled button. Although this feature expands somewhat the display of a narrow pulse, this display may be inadequate for detailed observation. For instance, if the pulse portion of the signal has a duty factor of less than 1%, setting up this display via the auto-setup feature will result in a display of a pulse duration that is less than 0.5% of the full screen. The pulse portion of the display would therefore still be too narrow to be viewed with any detail.

The invention overcomes this limitation of the "auto-setup" feature by magnifying the horizontal display of a narrow pulse of less than a predetermined duty factor to fill a substantial portion of the oscilloscope screen, regardless of the initial narrowness of the pulse.

SUMMARY OF THE INVENTION

An object of the invention, therefore, is to provide an improved method and system for automatically adjusting the oscilloscope display time axis to view a narrow pulse on an oscilloscope screen.

Another object of the invention is to adjust the display for pulse viewing only if the signal is less than a predetermined duty factor.

Yet another object of the invention is to adjust the display time axis so that a narrow pulse duration time is a substantial portion of the oscilloscope full scale time axis display.

To achieve these objects, a narrow pulse of less than a specified duty factor is detected and the time axis of the display is expanded for the pulse duration to consume a substantial portion of an oscilloscope screen. The method of the invention includes initially setting the time sweep of the oscilloscope for the sweep duration to contain a predetermined number of input signal cycles. The speed of the time sweep signal is then increased to expand the time axis of the display by a factor sufficient to place less than a single signal cycle within the sweep time and a pulse duration greater than a specified duty factor outside the time axis display. The input signal is then examined to detect if the pulse duration occurs within the faster sweep time. If it is, the pulse is displayed over about half of the oscilloscope screen.

In one aspect of the invention, the time magnified display of the signal cycle may be examined to see if its pulse is shorter in duration than the propagation delay through the oscilloscope circuitry. Such a pulse otherwise would not be detected, although it is less than the specific duty factor.

In another aspect of the invention, a specific duty factor can be selected by adjusting the sweep speed of the time sweep once the period of the signal cycle is determined. The sweep signal is set to contain only pulses equal to or less than the specified duty factor.

The foregoing and other objects, features, and advantages of the invention will become more apparent from the following detailed description of a preferred embodiment which proceeds with reference to the accompanying drawings.

BRIEF DESCRIPTION OF THE DRAWINGS

FIG. 2D is a fourth portion of the flowchart.

DETAILED DESCRIPTION

Circuit Design

Figure 1:
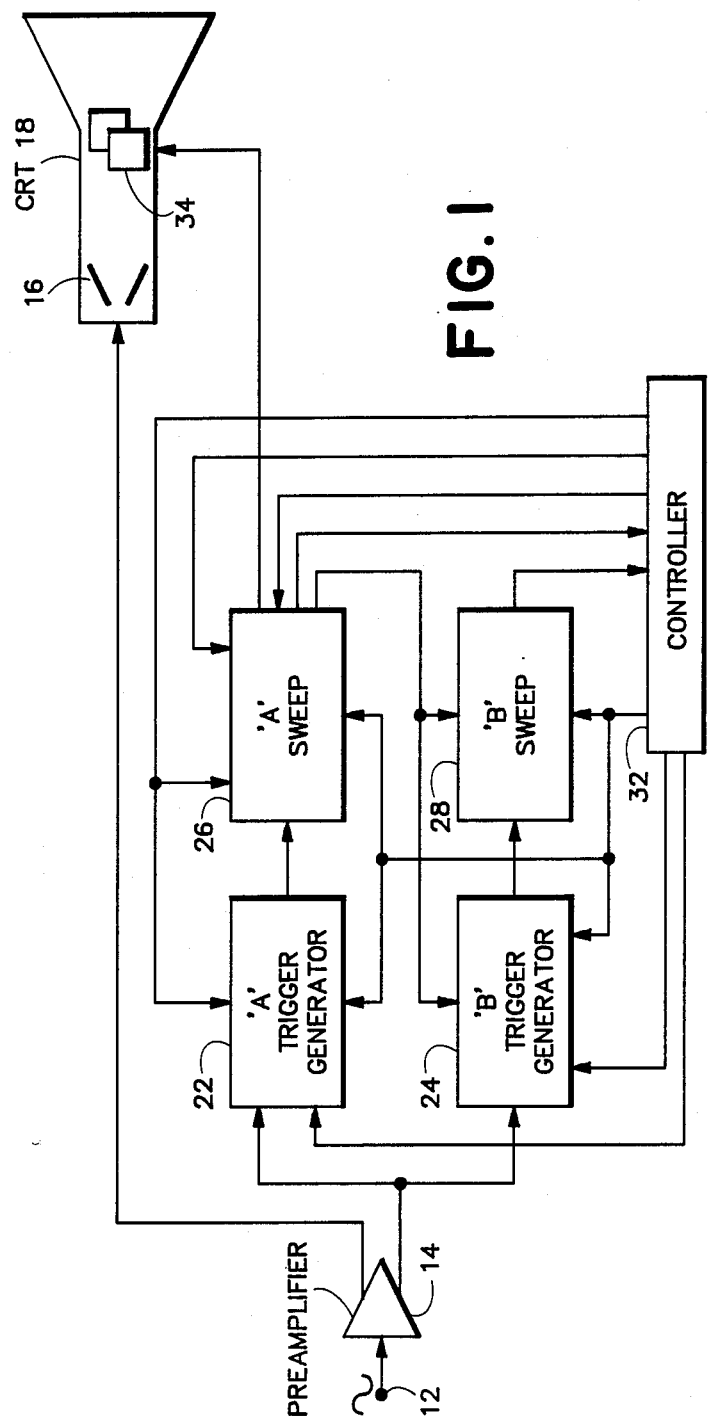
FIG. 1 is a block diagram of an automatic pulse display system according to the invention.

Referring to FIG. 1, a block diagram of a portion of a dual time-base oscilloscope embodying an automatic pulse display circuit is shown. Each of the blocks of the diagram, described in detail below, represent one or more circuit elements found in a conventional oscilloscope.

An input signal that may consist of a series of narrow repetitive pulses is received at an input terminal 12. The signal is routed through a vertical preamplifier 14 in a conventional manner to the vertical deflection plates 16 of a cathode ray tube 18 (CRT). The input signal also serves as the triggering source for the oscilloscope with internal triggering utilized, as indicated by connections to the A and B trigger generators 22 and 24.

The trigger generators 22 and 24 comprise, along with an A sweep 26 and B sweep 28, the sweep-generating circuitry of the oscilloscope, controlled by a controller 32 such as a microprocessor. Trigger generators 22 and 24 are of a typical design that is common and well known in the oscillography art. They include a voltage level comparator, a signal slope selector, and hysteresis for edge and level triggering. At a triggering point comprising a selected voltage and slope of the input signal, the trigger generators 22, 24 respond to the input signal by generating trigger signals. The triggering point for each generator 22, 24 is set by controller 32. The trigger signal generated by trigger generator 22 is applied to the A sweep 26, which suitably may be a sweep ramp generator with digital logic gating circuitry. The A sweep produces a gate signal that is routed to the Z-axis amplifier (not shown) to turn on the CRT electron beam and to the controller 32. The A sweep also produces a sweep signal in the form of a ramp voltage that is routed to the horizontal deflection plates 34 of the CRT 18 to sweep the electron beam across the CRT screen.

In a dual time base oscilloscope, the A sweep 26 can control the operation of the B trigger generator 24. and B sweep 28 via a B "hold-off" signal whose duration is controlled by a delay control voltage from the controller 32. The B "hold-off" enables the B trigger generator to trigger and the B sweep to produce a sweep signal, respectively, if the input signal reaches a B triggering point during the A sweep time. The hold-off signal in this embodiment is the inverse logic state of the A gate signal, going to a logic high state to disable the B trigger generator 24 when the A gate signal is absent and transitioning to a logic low state to enable the B trigger generator 24 after a delay time.

Assuming it is enabled by the hold-off signal, the B trigger generator 24, like the A trigger generator, produces a trigger signal that is routed to B sweep 28. The B gate sweep signal produced in response is shown routed to controller 32. This signal is also, of course, routed to CRT 18 and other points within the oscilloscope. Those connections have been omitted for clarity.

In brief review, B trigger generator 24 can trigger only during the absence of the hold-off signal, which is absent when A sweep gate signal is true. The gate signal is present so long as the A sweep 26 is generating a ramp voltage to sweep the electron beam across the screen of the CRT 18. If the triggering point for the B trigger generator occurs on the input signal after the A sweep signal has completed its pass, then the B trigger generator cannot trigger. The B trigger generator will also not trigger if the triggering point occurs before the A sweep signal is generated. This situation can occur because of the propagation delay from the detection of the A triggering point to the time the A sweep is actually generated. In this embodiment, this delay is about 70 nanoseconds.

In addition to setting the triggering points and the length of the B hold-off signal, the controller 32 also controls the operation of the sweep generating circuitry in other ways. Controller 32 generates a variable sweep control signal that can slow the speed of the A sweep by a ratio of up to 2.5. The triggering mode for the trigger generators 22, 24 and sweeps 26, 28 is also selected through the controller 32. A hold-off signal for the A trigger generator 22 and A sweep gate 26 is also generated by controller 32. This signal keeps the A trigger generator from triggering again before the A sweep signal has completed its pass from a previous trigger signal.

Method of Operation

In the method of the invention, a narrow pulse on the input signal is checked to see if its duty factor is less than a predetermined percentage of the signal cycle, and if so, the axis of the display pulse is magnified to fill a substantial portion of the CRT screen, preferably 2 to 5 divisions of a 10 division screen. In this particular embodiment, the predetermined duty factor is a range from 4 to 12.5% of the signal cycle. However, any percentage duty factor may be chosen by adjusting the controller 32, as will be described. The controller adjusts the sweep speed of the A sweep in the 1-2-5-10-20-50... sequence of the manual controls by setting values in registers associated with those controls. For example, five "clicks" of the manual control originally set at one microsecond per division will slow the time per division to 50 microseconds per division. The controller 32 bypasses the manual control to set the registers electronically.

Figure 2A:
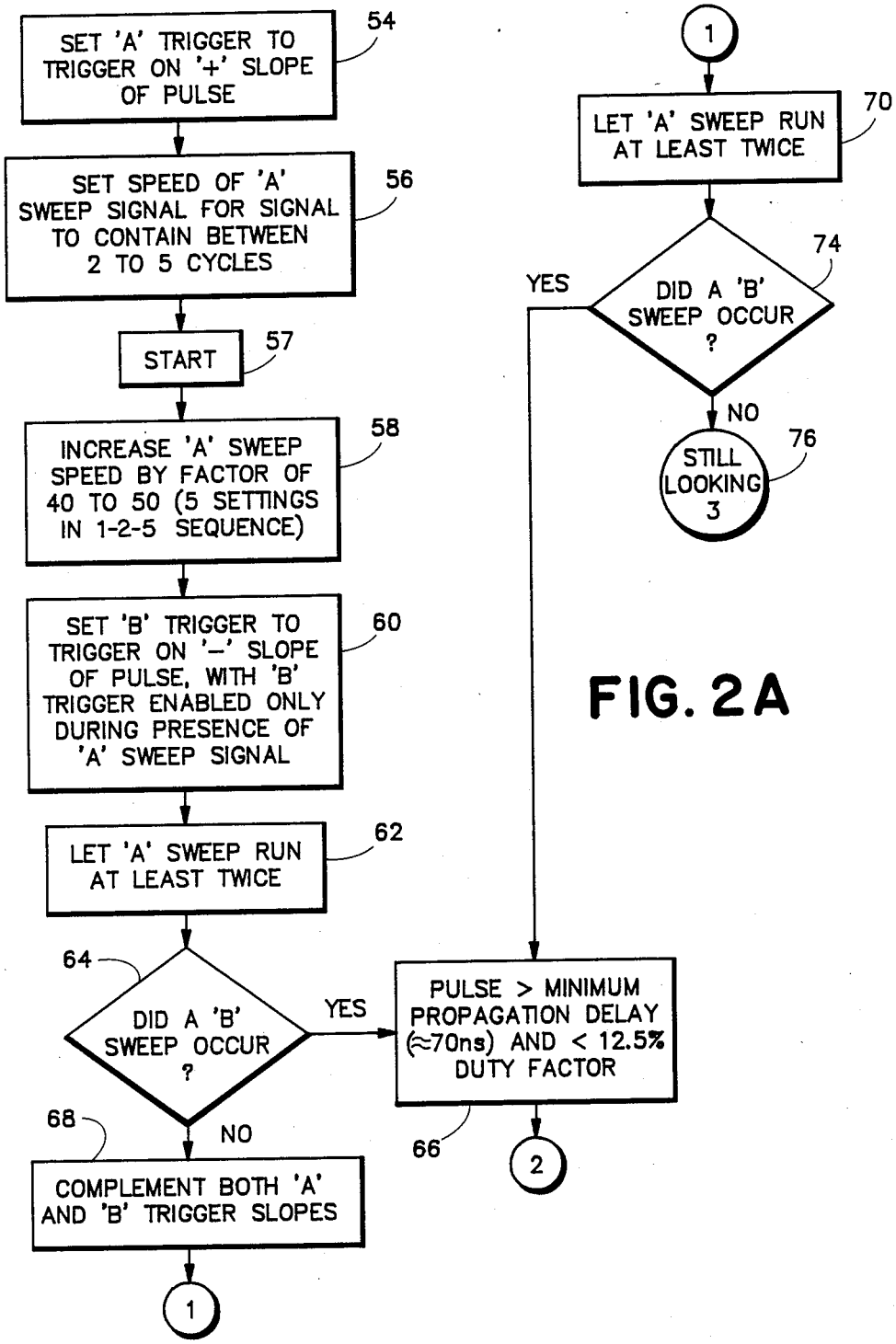
FIG. 2A is a portion of a flowchart according to the method of the invention.

Referring to FIG. 2A, a flowchart of a procedure according to the method is shown. The A trigger generator 22 is set by controller 32 to trigger on a selected slope of the signal pulse, preferably the positive slope to begin (box 54). Assuming the pulse is too narrow to be seen clearly with the present time/division setting of the time sweep, the "auto-setup" feature is invoked by pressing a contact button (box 56). The "auto-setup" feature, adjusts the amplitude of the signal to screen size and displays a predetermined range of signal cycles, i.e., two to five signal cycles, during the sweep signal of A sweep 26.

The pulse of the displayed signal, however, may still be too narrow to be easily viewed. The method of the invention is then invoked at the start (box 57).

The speed of A the sweep signal 26 is then increased by the controller 32 five settings of the sequence (box 58). This insures that the time axis display of the signal cycles are expanded by at least a factor of 40 and possibly 50 so that less than a single signal cycle lies within the sweep signal. If the pulse portion (with both leading and trailing edge) of a signal cycle is still contained within the A sweep signal after the expansion, then the pulse will eventually be displayed. That portion, defined as a percent duty factor, has a range depending on the number of signal cycles captured by the auto-setup feature and the expansion factor. For example, with two cycles captured and an initial speed setting at 1, the factor will be 50 and the maximum pulse percent duty that will be contained in the A sweep signal is 4%. With five cycles captured and an initial speed setting at 5, the factor will be 40 and the maximum pulse percent duty factor that will be contained in the A sweep signal is 12.5%. These extremes give a range of 4 to 12.5%. This range guarantees that the display of pulses with a percent duty factor of 4% or less will be expanded. Whether the expanded display of the pulse is contained within the A sweep signal is determined by the triggering of the B trigger generator 24, which is set by controller 32 to trigger on the pulse slope opposite the selected slope of the A trigger generator (box 60). The B trigger generator 24 is enabled, as mentioned previously, by the low logic state of the B hold-off signal which is low only during the presence of the A sweep signal. As the speed of the A sweep signal is increased, the duration of the B hold-off signal correspondingly decreases.

The controller 32 times for at least two cycles of the sweep signal to determine if a B sweep gate signal is produced during any of the sweeps (box 64). If a B sweep signal is produced, then the pulse is identified as having a duty factor less than 4% (and possibly up to 12.5%), since both slopes defining the pulse portion of the signal cycle that is, both the leading and trailing edges, were detected during the A sweep signal. The pulse width must also be greater than the propagation delay of the signals through A trigger generator 22 and A sweep 26 (box 66). A pulse shorter in duration than this delay would not be detected because the B trigger generator 24 would not be enabled before the arrival and passing of its triggering point, the opposite pulse slope.

The lack of a B sweep signal does not necessarily mean the pulse is greater than the specified duty factor. The pulse may be a negative-going pulse, in which case the A trigger generator 24, set to trigger on a positive-going pulse, would have triggered at the end of the pulse rather than at the beginning. To check for the possibility of a negative-going pulse, the triggering slopes of A and B trigger generators are complemented (box 68) and A sweep 26 is again monitored for two sweeps (box 70) for a B gate sweep signal to occur (box 74). If the B sweep signal still does not occur during the A sweep signal, then the pulse width is either greater than the specified duty factor or is less than the delay through the system, 70 nanoseconds. These possibilities are represented by the "still looking 3" circle 76.

Figure 2B:
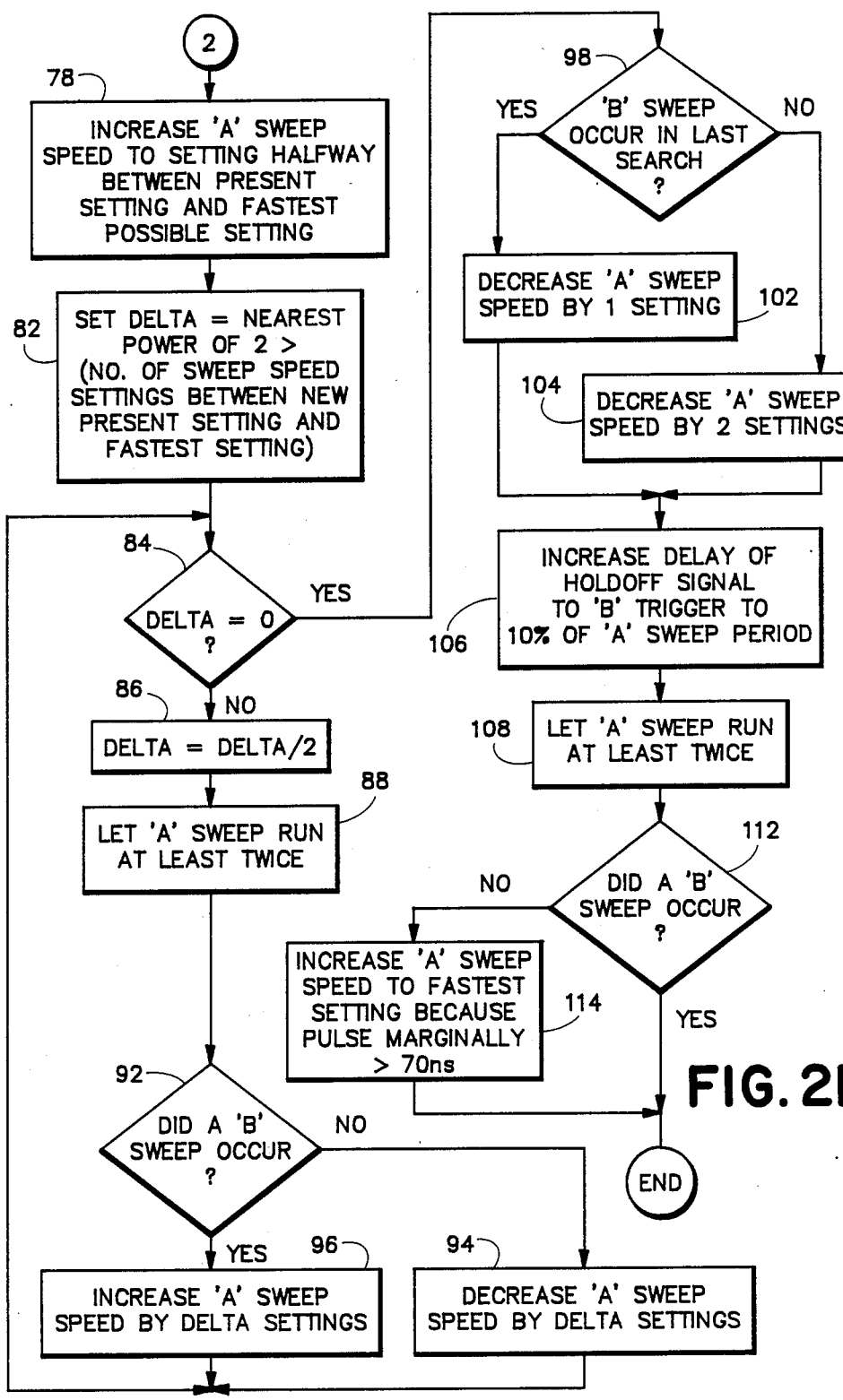
FIG. 2B is another portion of the flowchart of FIG. 2A.

Referring to FIG. 2B, a portion of the flowchart 15 shown that adjust the width of an identified pulse to fill two to five divisions of the CRT screen. Once the controller 32 has identified a pulse (box 66), it increases the speed of the A sweep signal to a setting halfway between the present setting and the maximum possible speed setting (box 78). A variable, "delta," is then set to the nearest power of 2 greater than the number of sweep speed settings of the oscilloscope between the new setting and the fastest setting (box 82). Delta is then checked to see if it is zero (box 84). If it is not, it is halved (box 86) and the A sweep signal is monitored for at least two sweeps (box 88) to see if a B sweep signal occurs (box 92). If no B sweep signal is detected, the A sweep speed is decreased by delta settings (box 94). If a B sweep signal is detected, however, the A sweep speed is increased by delta settings (box 96). Delta is again checked for zero (box 84), halved (box 86), and the A sweep signal again monitored (box 88). This procedure continues until delta is less than one, in which case it is regarded as zero.

At the point where the procedure exits this inner loop, the A sweep 26 will be at the maximum sweep speed for triggering the B trigger generator or be one speed setting faster. The B sweep is again checked for a sweep signal (box 98). If the B sweep signal occurred, the A sweep is decreased in speed by one setting (box 102). If no B sweep signal occurred, the A sweep speed is decreased by two settings (box 104) bringing the A sweep to the same speed by either route. The change in setting causes the pulse portion to cover fewer divisions, because one decrease, say from 2 to 1, is a twofold decrease in speed and two settings, say 5 to 2 to 1, is a fivefold decrease in speed. With 10 divisions on the screen, the reduction will leave the pulse portion covering between 5 and 2 divisions which is the desired display.

Often in repetitive signals such as of interest here, the pulse duration will vary cyclically by a marginal amount. Such variance can cause the B trigger generator to trigger on some signal cycles and not to trigger on others. To create a margin for error, the propagation delay of the B hold-off signal is increased to 10% (box 106) of the A sweep signal period via a command from controller 32. This delay requires that the pulse then be the equivalent of at least one screen division in width in order to trigger the B trigger generator. The A sweep signal is again monitored for at least two runs to see if the B signal occurs (boxes 108, 112). If the signal does not occur, the pulse is considered marginally greater than 70 nanoseconds (box 114) and the A sweep is changed to its maximum speed to display the pulse as clearly as possible. If the sweep signal does occur, on the other hand, no further change in the sweep speed is necessary and the time expanded display of the pulse appears on the CRT 18.

Figure 2C:
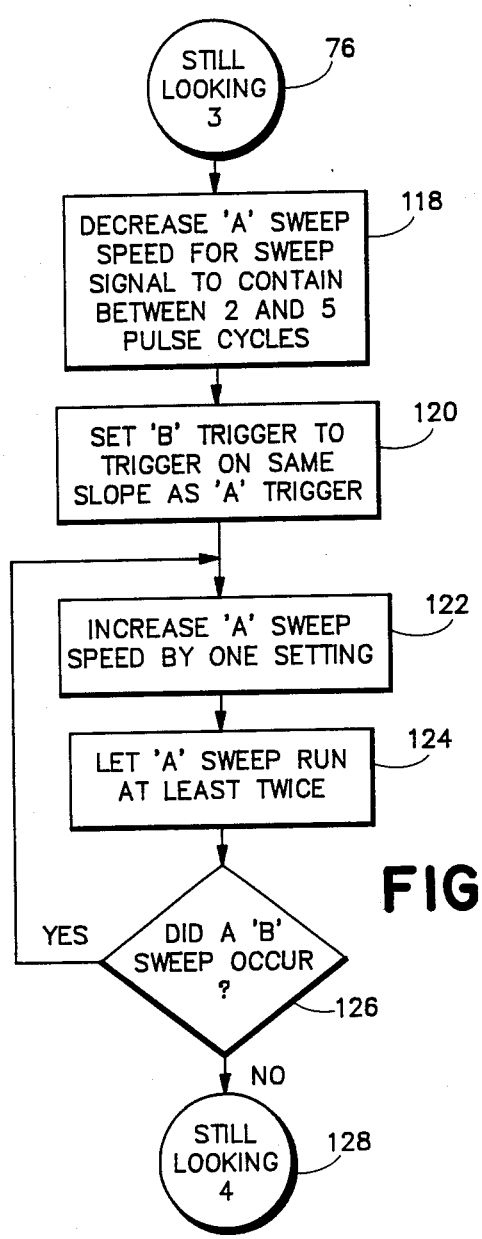
FIG. 2C is a third portion of the flowchart.
Figure 2E:
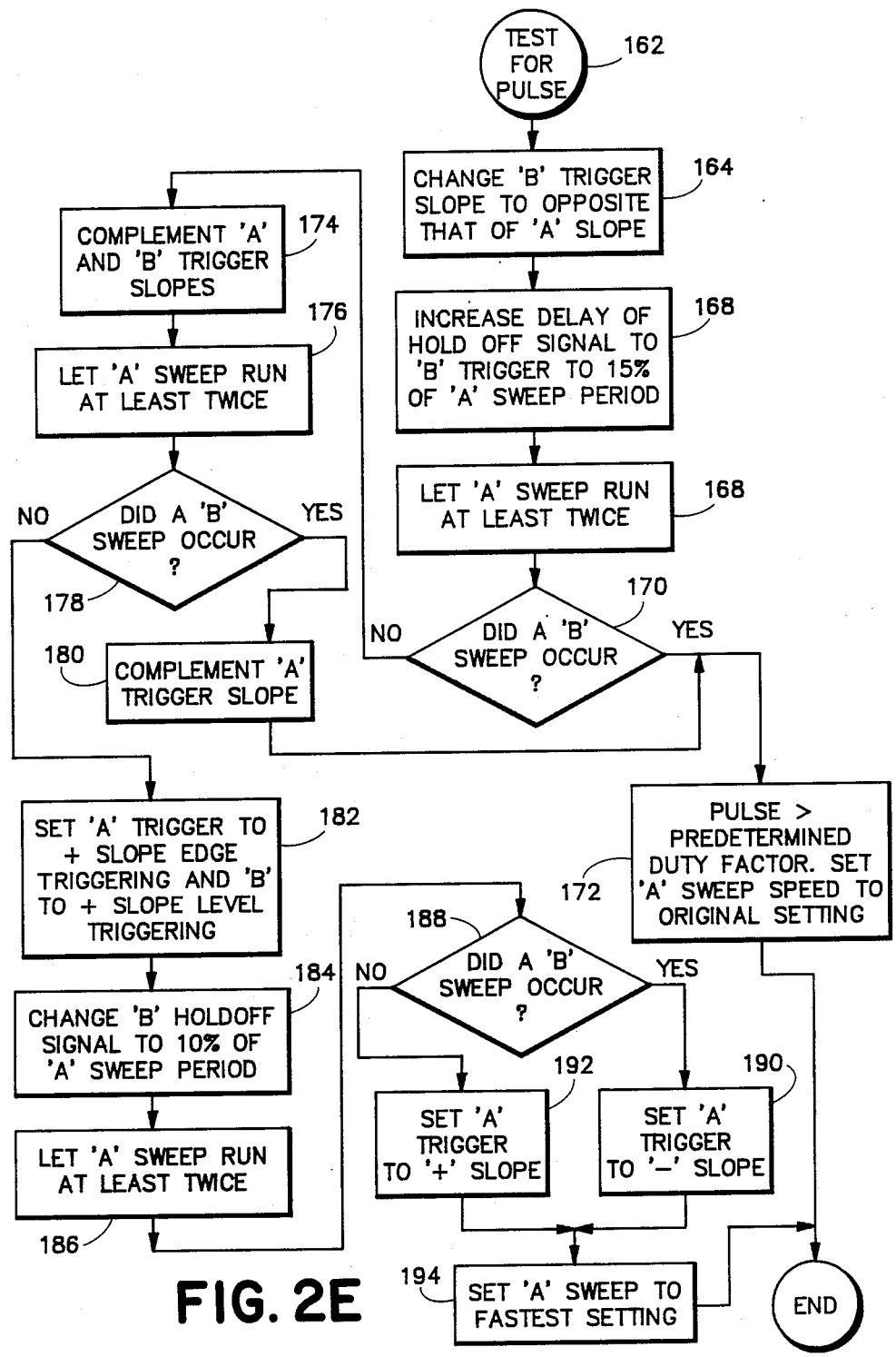
FIG. 2E is a fifth portion of the flowchart.

Recall that in FIG. 2A, a branch of the flowchart ended "still looking 3" at the pulse duty factor. It had been determined by circle 76 that the pulse was either shorter in duration than the propagation delay through the circuitry or greater in duration than the minimum range of the duty factor, up to 12.5%. The difference is important, for it is desirable to display the narrow pulse but not the wider pulse. FIGS. 2C through 2E show how the two pulses are distinguished.

Referring to FIG. 2C, this portion of the flowchart adjusts the speed of the A sweep so that the sweep signal contains less than one complete signal cycle. The speed of the A sweep is returned to the setting generated by the "auto-setup" feature (box 118) where two to five cycles are displayed. The B trigger generator 24 is then set to trigger on the same signal slope as the A trigger generator (box 120). An inner loop of the flowchart is entered to manipulate the A sweep speed until the sweep signal contains less than one complete signal cycle. First the sweep speed is increased by a setting (box 122). The A sweep then runs at least twice (box 124) to determine if a B sweep occurs (box 126). So long as it does, more than one signal cycle is contained in the sweep signal, and the sweep speed is again increased. Eventually the sweep signal contains less than one complete input signal cycle and the flowchart branches to "still looking 4" at circle 128. One setting decrease in speed would result in at least one complete signal cycle being contained within the A sweep signal.

The portion of the flowchart shown in FIG. 2D selects a speed for the A sweep so that its sweep signal contains $\frac{1}{2}$ to $\frac{3}{4}$ of an input signal cycle. The controller 32 first slows the present sweep setting by a ratio of 2, via the variable speed control to the A sweep to cut the A sweep speed by one-half (box 130). The A sweep is then run at least twice (box 132) to see if a B sweep signal occurs (box 134). If the signal cycle was slightly less in duration than the sweep signal, then the B sweep will occur and the variable speed ratio is changed to 1.5 (box 136). A sweep is then run at least twice (box 138) to see if a B sweep signal still occurs (box 140).

If it does, the A sweep speed is increased one setting (box 144) and the setting is examined to see if it is a 2 in the 1-2-5 sequence (box 146). This examination is done because the increase in speed can be a factor of 2 or 2.5, depending on the setting. With a final setting of 2, the factor is 2.5 and the variable ratio is changed to 2 (box 148). With a final setting of 1 or 5, the variable ratio is changed 1.75 (box 150). These changes in the sweep speed ensure that the initial sweep speed upon entering FIG. 2D is either 2/2.5 (or 0.8) of the final sweep speed via box 148 and 1.75/2 or 0.875 via box 150. The faster sweep speed guarantees that the A sweep time contains more than $\frac{1}{2}$ but less than a full signal cycle.

Assuming no B sweep occurs at box 140, then the signal cycle is now greater in duration than the sweep speed and the delay ratio is changed to 1.25 (box 151). The new sweep speed is slower than the original sweep speed by a factor of 1.25. This speed will cause the A sweep time to contain more than $\frac{1}{2}$ but less than a full signal cycle.

Returning to decision box 134, if a B sweep signal did not occur after the sweep speed was slowed by a factor of 2, the variable ratio is increased to 2.5 (box 152). The A sweep is then run at least twice (box 154) to see if a B sweep occurred (box 156). If it did occur, the speed is increased by changing the ratio to 1.5 (box 158). If it did not, the speed is decreased to a ratio of 2 (box 160). The end result in either case is that greater than one-half and less than one cycle are contained in the A sweep signal.

The next step after adjusting the A sweep signal to contain the desired fraction of an input signal is to test for pulse (circle 162). FIG. 2E shows the portion of the flowchart for doing so. First the B trigger slope is changed to be opposite that of A (box 164). A margin for error is then created by increasing the duration of the B hold-off signal to 15% of the A sweep period (box 166). The A sweep is then run at least twice (box 168) to see if a B sweep occurs (box 170).

If a B sweep signal is detected, then the pulse must be greater than the range of the specified duty factor (box 172). A pulse less than the duration of the delay through the circuit would not have been detected.

If a B sweep is not detected, the A and B trigger slopes are complemented (box 174) and the A sweep signal run at least twice again (176) to see if a B sweep signal occurs (178). If it does, the A trigger slope is complemented (box 180) and the pulse is determined to be greater than the predetermined duty factor (172).

If no B sweep signal occurs after the complementing of the A and B trigger slopes, then the pulse is determined to be a narrow pulse and should be displayed. However, at this point, it has not been determined if the pulse is a negative-going pulse or a positive-going pulse. To make that determination, the A trigger generator is set to trigger on the positive or plus slope of the pulse and the B trigger generator 24 is changed from edge triggering to a voltage level triggering (box 182) on the same polarity (positive) as the edge triggering of the A trigger, at about midway of the pulse amplitude. The B hold-off signal is then placed at 10% of the A sweep period (box 184) to ensure that the level detected is not the level of the pulse but the level of the rest of the signal cycle. The A sweep signal is run at least twice (box 186) and a check is made to determine if a B sweep signal occurred (box 188). If it did occur, the pulse is negative-going and the A trigger is set to the minus slope (box 190). If it did not occur, the A trigger remains set to the positive slope (box 192). In either case, the A speed setting is then set to its fastest possible setting (box 194) for maximum display of the pulse.

The method described so far has a predetermined range of duty factors that is detected, 4 to 12.5%. A specified duty factor, such as a pulse that is 5% of a signal cycle, can also be detected through a different procedure illustrated in FIGS. 3A and 3B.

Figure 3A:
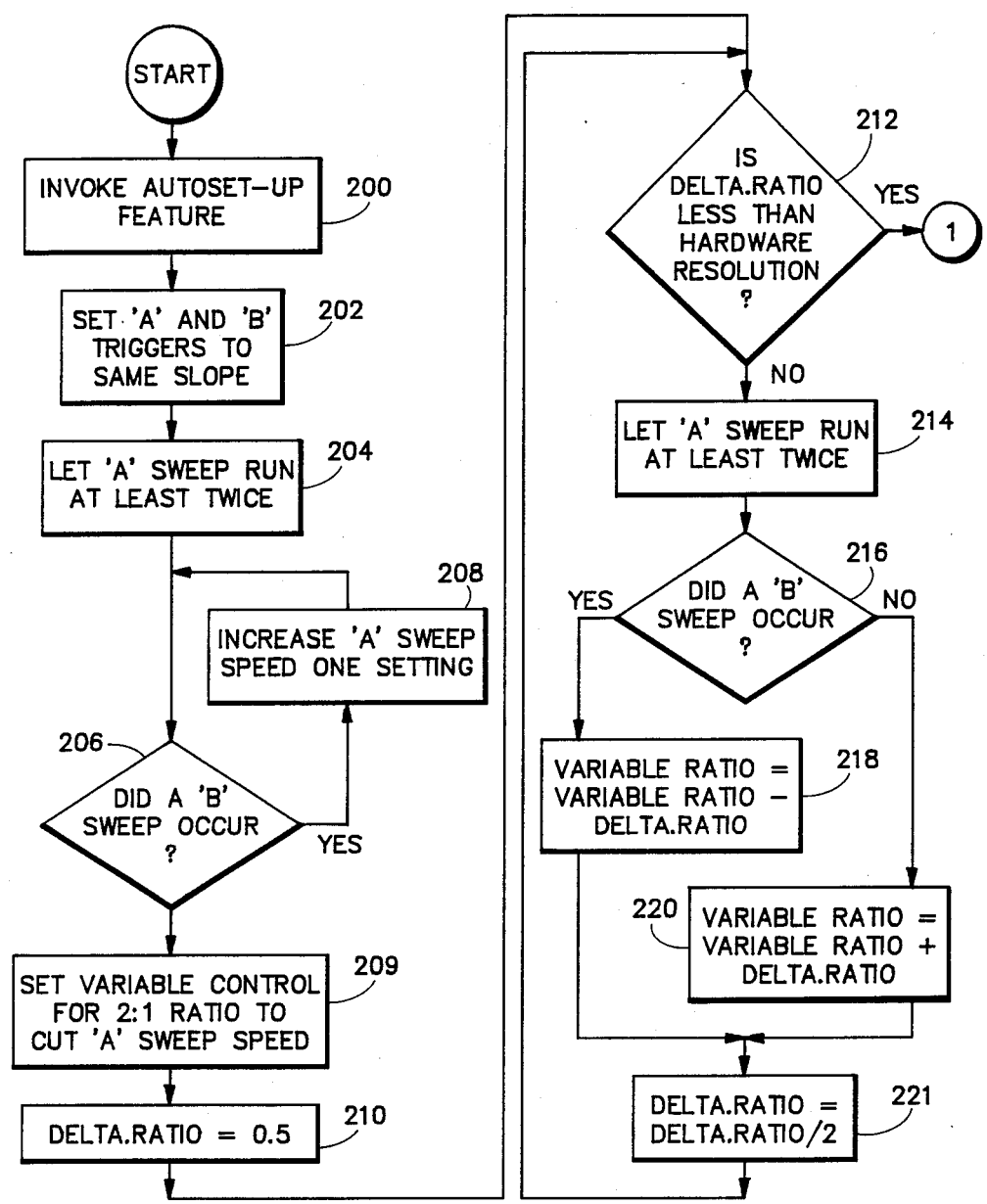
FIG. 3A is a portion of a flowchart according to a second method of the invention.

In FIG. 3A, the "auto-setup" feature is invoked to obtain at least one complete input signal cycle during an A sweep signal (box 200). The A and B generators are then set to edge trigger on the same input slope (box 202) and the A sweep is run at least twice (box 204) to determine if a B sweep occurs (box 206). If it does, the A sweep is increased in speed a setting in the 1-2-5 sequence (box 208) until just less than one input signal cycle is contained in the sweep signal.

The A sweep signal is then set equal to the input signal cycle by adjusting the variable speed control via the controller 32. Initially the variable ratio is set to 2 to 1 (box 209) to cut the A sweep speed in half and decrease the time display of the input signal. A variable delta.ratio is then set to 0.5 (box 210). The delta.ratio is then checked to see if it is less than the resolution limit of the hardware, typically 1/512 (box 212). At first delta.ratio will be greater than the resolution limit, and the A sweep is run to check if a B sweep occurs within a 2 to 1 ratio (boxes 214, 216). If a sweep does occur, the variable ratio is decreased by delta.ratio (box 218) to expand the time display. If it is not, the variable ratio is increased by the delta.ratio (box 220) to decrease the time display. Delta.ratio is then halved (box 221) and the method loops back to decision box 212 to check the resolution limit once again. The flow through this inner loop headed by box 212 continues until the A sweep signal contains almost exactly one input signal cycle within the limit of the hardware's resolution capability.

Figure 3B:
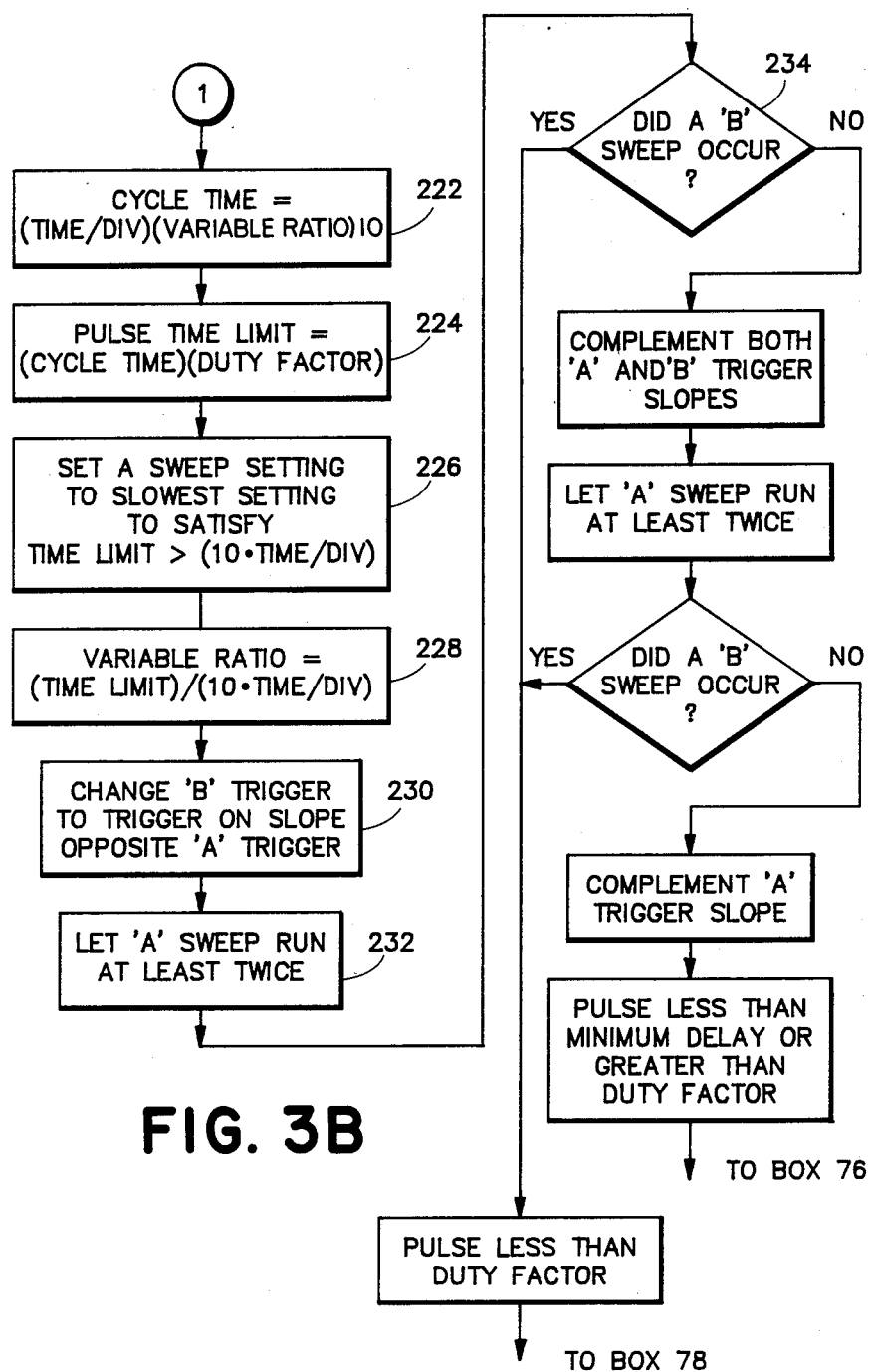
FIG. 3B is a second portion of the flowchart of FIG. 3A.

FIG. 3B shows the portion of the flowchart used to calculate the width of the pulse portion of the signal cycle and to determine if that width is within a specified duty factor. The signal cycle period is first calculated (box 222) by the following equation:

$$\text{Cycle period} = (\text{time/div}) (\text{variable ratio}) * 10 \text{ div.} \quad (1)$$

The duration of a pulse of equal or less than a specified duty factor is next calculated (box 224):

$$\text{Pulse limit} = \text{Cycle period} * \text{specified duty factor.} \quad (2)$$

For example, a 110 millisecond signal cycle may have a pulse limit of up to 5.5 milliseconds if the pulse duty factor is specified as 5%.

The slowest A sweep setting for displaying the pulse is then calculated (box 226):

$$\text{Largest time/div} < (\text{Pulse limit}/10)$$

Continuing this example, the largest time/div setting less than 0.55 milliseconds (550 microseconds) is 500 microseconds.

Because the time/div sequence are discrete, the variable sweep control is used to adjust the A sweep speed to the exact setting required for a pulse of the specified duty factor to equal the duration of the A sweep signal (box 228):

$$\text{Variable ratio} = (\text{Pulse limit})/(10 \text{ div} * (\text{Largest time/div}))$$

Continuing the example, the variable ratio equals 1.1 and the sweep control is automatically adjusted by the controller 32 accordingly.

The pulse check is then made by changing the B trigger to trigger on the opposite slope of the A trigger (box 230). The A sweep is run at least twice (box 232), and the B sweep is checked for a sweep signal (234). If no signal is detected, then the pulse is less than the minimum delay or greater than the predetermined duty factor (box 236). However, if a pulse is detected, then it is equal to or less than a predetermined duty factor (box 238).

The flowchart of FIGS. 3A and 3B merges with the flowchart of FIGS. 2A through 2E at this point. If the pulse is less than the predetermined duty factor, the flowchart continues with box 78 at the beginning of FIG. 2B. On the other hand, if the pulse is less than the minimum propagation delay or is greater than the specified duty factor, the flowchart continues at box 76 at the beginning of FIG. 2C.

Having illustrated and described the principles of the invention in a preferred embodiment, it should be apparent to those skilled in the art that the invention can be modified in arrangement and detail without departing from such principles. We claim all modifications coming within the spirit and scope of the following claims.

We claim:

1. In an oscilloscope having dual time sweeps and trigger generators, a method of automatically expanding the display of a repetitive input signal having a pulse portion of less than a specified duty factor, comprising:

setting the speed of the time sweep for the sweep signal to contain a predetermined number of input signal cycles;

increasing the speed of the time sweep to expand the signal cycles, the speed increased by a factor sufficient to place less than a single signal cycle within the sweep signal and an expanded pulse portion of greater than the specified duty factor outside the sweep signal;

detecting whether an expanded pulse is contained within the faster sweep signal; and displaying the expanded pulse if so contained.

2. The method of claim 1 including:

adjusting the sweep speed until the sweep signal and the detected pulse are of about the same duration;

decreasing the sweep speed to display the detected pulse in no more than half of the oscilloscope screen.

3. The method of claim 1 in which detecting the expanded pulse includes detecting a positive slope of the expanded pulse on a first trigger generator and a negative slope on a second trigger generator and if both slopes are not detected, changing the polarities of the trigger generators and detecting the negative slope on the first trigger generator and the positive slope on the second trigger generator.

4. The method of claim 1 including the following steps for determining the polarity of a pulse shorter in duration than the propagation delay through the oscilloscope, comprising:

adjusting a first trigger generator to trigger on an edge of a pulse;

adjusting a second trigger generator to trigger on a voltage level of the pulse relative to a threshold voltage level, the voltage level of the same polarity as the edge;

delaying the triggering of the second generator beyond the propagation delay of the oscilloscope so that the generator does not trigger on the pulse portion of the input signal;

detecting whether the second trigger generator has triggered; and changing the polarity of the first trigger generator if the second trigger generator has triggered.

5. In a dual time base oscilloscope having dual trigger generators and time sweeps, a method of automatically expanding the display of a repetitive signal having a pulse of less than a specified duty factor, comprising:

setting a first trigger generator to trigger on a selected slope of the signal pulse, each pulse having a positive and negative slope;

setting a second trigger generator to trigger on the signal pulse slope opposite the selected slope;

enabling the second trigger generator to trigger only while a first time sweep actuated by the first trigger is active;

setting the speed of the first time sweep for the sweep signal to contain a predetermined number of signal cycles during the sweep;

increasing the speed of the first time sweep to expand the signal cycles, the speed increased by a factor sufficient to place less than a single signal cycle within the sweep signal and an expanded pulse on that signal of greater than the specified duty factor outside the sweep signal;

detecting whether both the first and second trigger generators have triggered on the expanded pulse during the increased-speed time sweep; and displaying the expanded pulse if both trigger generators have triggered.

6. In an oscilloscope, an automatic pulse display circuit for expanding the display of a repetitive input signal having a pulse portion of less than a specified duty factor, comprising:

first means for triggering a time sweep in response to the input pulse, the trigger means triggering on a selected slope of a pulse, the pulse having a positive and negative slope;

second means for triggering on the pulse slope opposite the selected slope, the second means enabled for triggering only while the time sweep triggered by the first means is active; and controller means for detecting and expanding the display of a pulse of less than the specified duty factor, the controller means first setting the speed of the time sweep for the sweep signal to contain a predetermined number of signal cycles during a sweep and then increasing the speed of the time sweep to expand the signal cycles, the speed increased by a factor sufficient to place less than a single signal cycle within the sweep signal and an expanded pulse on that signal of greater than the specified duty factor outside the sweep signal, the controller means in communication with the first and second trigger means to detect whether both have triggered during the signal of the faster time sweep signal and causing the display of the expanded pulse upon such detection.

7. In a dual time base oscilloscope having dual trigger generators and time sweeps and variable delay control, a method of automatically expanding the display of a repetitive input signal having a pulse of less than the specified duty factor, comprising:

setting both trigger generators to trigger on the same pulse slope;

adjusting the sweep speed in response to triggering of the trigger generators to contain a single signal cycle;

calculating the duration of the specified duty factor for the signal cycle;

adjusting the sweep speed in response to the calculation so that the sweep signal period matches the duration of the specified duty factor portion;

adjusting one of the trigger generators to trigger on an opposite pulse slope;

detecting whether both trigger generator trigger to indicate an expanded pulse is contained within faster sweep signal; and displaying the expanded pulse if both trigger generators have triggered.

* * * * *